(12) United States Patent
Funada et al.

(10) Patent No.: US 7,531,753 B2
(45) Date of Patent: May 12, 2009

(54) SUSPENSION BOARD WITH CIRCUIT

(75) Inventors: Yasuhito Funada, Osaka (JP); Tetsuya Ohsawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 383 days.

(21) Appl. No.: 11/123,181

(22) Filed: May 6, 2005

(65) Prior Publication Data
US 2005/0248885 A1 Nov. 10, 2005

(30) Foreign Application Priority Data
May 10, 2004 (JP) .............................. 2004-140319

(51) Int. Cl.
*H05K 1/00* (2006.01)
(52) U.S. Cl. ..................... 174/254; 361/749
(58) Field of Classification Search ................ 174/254; 361/749–751
See application file for complete search history.

(56) References Cited

U.S. PATENT DOCUMENTS

| 5,219,640 | A | | 6/1993 | Gazit et al. | |
|---|---|---|---|---|---|
| 5,594,607 | A | | 1/1997 | Erpelding et al. | |
| 5,606,477 | A | | 2/1997 | Erpelding et al. | |
| 5,699,212 | A | * | 12/1997 | Erpelding et al. | ........ 360/245.8 |
| 5,734,523 | A | * | 3/1998 | Scheidecker et al. | ..... 360/234.5 |
| 5,737,837 | A | * | 4/1998 | Inaba | ........................ 29/884 |
| 5,781,379 | A | | 7/1998 | Erpelding et al. | |
| 6,046,887 | A | | 4/2000 | Uozumi et al. | |
| 6,096,482 | A | | 8/2000 | Omote et al. | |
| 6,266,214 | B1 | * | 7/2001 | Khan | ...................... 360/245.9 |
| 6,466,413 | B1 | * | 10/2002 | Takasugi | ................. 360/245.9 |
| 2003/0183918 | A1 | | 10/2003 | Kang | |

FOREIGN PATENT DOCUMENTS

| JP | 8-87845 | 4/1996 |
|---|---|---|
| JP | 9-54930 | 2/1997 |
| JP | HEI 10-265572 | 6/1998 |
| JP | 11-39626 | 2/1999 |
| JP | 2002-269712 | 9/2002 |

* cited by examiner

*Primary Examiner*—Jeremy C Norris
(74) *Attorney, Agent, or Firm*—Jean C. Edwards, Esq.; Akerman Senterfitt

(57) ABSTRACT

A suspension board with circuit that can allow precise adjustment of flotation (flotation angle) of even a small-sized slider to a magnetic disc even when the outrigger portions are reduced in rigidity. A gimbal portion of the suspension board with circuit is formed by a tongue portion for mounting a magnetic head thereon, and outrigger portions provided at both sides of the tongue portion, and an opening is formed in the insulating cover layer 5 so that the conductor layer can be exposed therefrom in the outrigger portions. This can allow reduction in rigidity of the outrigger portions, and as such can allow precise adjustment of flotation (flotation angle) of the slider to the magnetic disc even when a small-sized slider is mounted on the gimbal portion.

7 Claims, 5 Drawing Sheets

FIG. 2
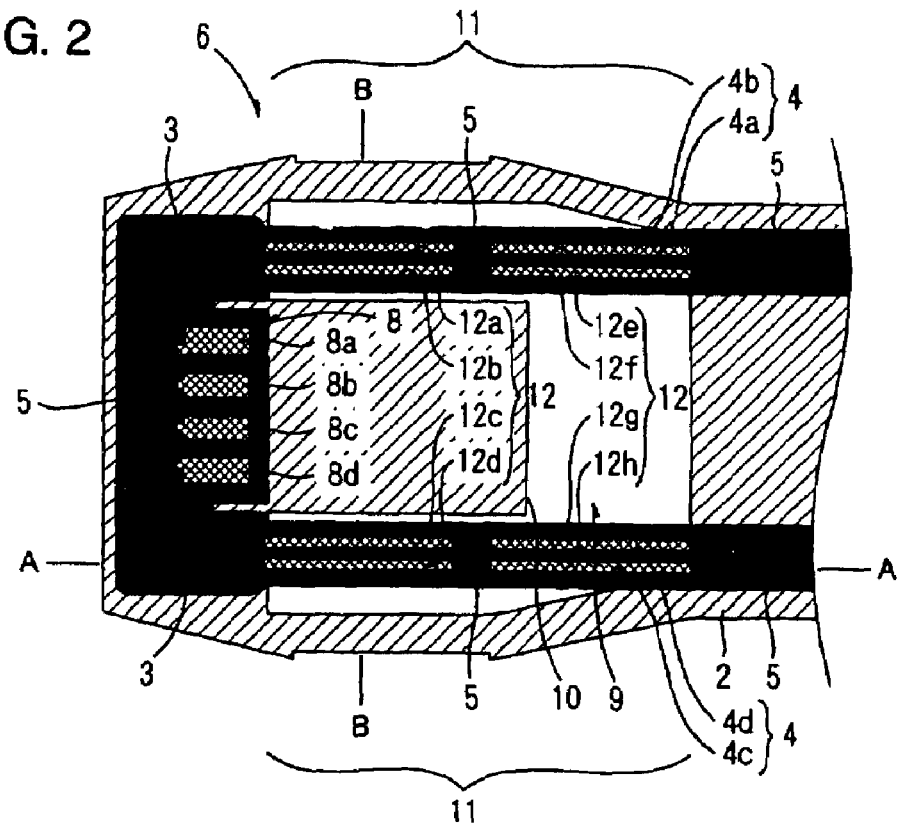
FIG. 3
(a)
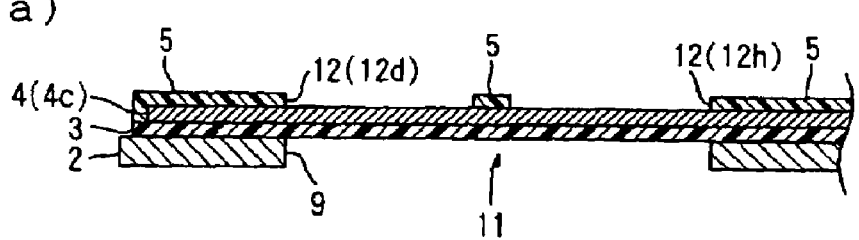
(b)
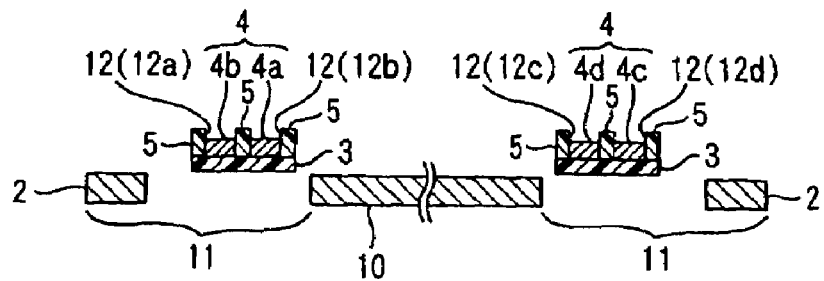

SUSPENSION BOARD WITH CIRCUIT

BACKGROUND OF THE INVENTION

1. Field of the Invention

The present invention relates to a suspension board with circuit and, more particularly, to a suspension board with circuit used for a hard disc drive.

2. Description of the Prior Art

A suspension board with circuit used for a hard disc drive is a wired circuit board having a wiring circuit pattern which is integrally formed on a suspension board for supporting a magnetic head, for connection between the magnetic head and a read/write board. The suspension board with circuit is being in widespread use in recent years in that it can hold the magnetic head against an airflow generated when the magnetic head and the magnetic disk run relative to each other, while supporting the magnetic head closely spaced from the magnetic disc, to provide good flotation of the magnetic head.

This suspension board with circuit usually has at a front end portion thereof a gimbal portion comprising a tongue portion for mounting a magnetic-head mounting slider, and outrigger portions arranged at both widthwise sides of the tongue portion and forming the wiring circuit pattern thereon. In this configuration of the suspension board with circuit, rigidity of the outrigger portions plays a key factor for precise adjustment of the flotation (flotation angle) of the slider to the magnetic disc.

On the other hand, it also has for example the construction that an insulating layer of polyimide resin is formed on a substrate of stainless foil; a predetermined pattern circuit of a copper conductor layer is formed in a thin film form on the insulating layer; terminals are formed on the pattern circuit; and the whole surface of the pattern circuit, except the terminals, is covered with a cover layer, to protect the pattern circuit (e.g. JP Laid-open (Unexamined) Patent Publication No. Hei 10-265572).

Meanwhile, in accordance with miniaturization of the slider in recent years, further precise adjustment of the flotation (flotation angle) of the slider to the magnetic disc is being demanded.

However, since the outrigger portions of the suspension board with circuit, especially those designed for a small-sized slider, have high rigidity, it is hard to make a precise adjustment of the flotation (flotation angle).

SUMMARY OF THE INVENTION

It is the object of the invention to provide a suspension board with circuit that can permit precise adjustment of flotation (flotation angle) of even a small-sized slider to a magnetic disc even when the outrigger portions are reduced in rigidity.

The present invention provides a suspension board with circuit comprising a metal supporting layer, an insulating base layer formed on the metal supporting layer, a conductor layer formed on the insulating base layer, and an insulating cover layer, formed over the insulating base layer, to cover the conductor layer with it, the suspension board with circuit further comprising a tongue portion for mounting a magnetic head thereon, and outrigger portions provided at both sides of the tongue portion, wherein at least a part of the conductor layer is exposed from the insulating cover layer in the outrigger portions.

In the suspension board with circuit of the present invention, it is preferable that the conductor layer in the outrigger portions has a length continuously extending along a longitudinal direction of the suspension board with circuit of 2 mm or less and is exposed from the insulating cover layer.

In the suspension board with circuit of the present invention, it is preferable that the metal supporting layer is provided in the outrigger portions, not to overlap with the insulating base layer, the conductor layer, and the insulating cover layer.

According to the suspension board with circuit of the present invention, since at least a part of the conductor layer is exposed from the insulating cover layer in the outrigger portions, the conductor layer can be reduced in rigidity to such an extent that no insulating cover layer is provided on the exposed part of the conductor layer. This can permit precise adjustment of flotation (flotation angle) of even a small-sized slider to a magnetic disc.

BRIEF DESCRIPTION OF THE DRAWINGS

In the drawings:

FIG. 2 is a plane view of a principal part of a gimbal portion of the suspension board with circuit shown in FIG. 1.

FIG. 3 shows the gimbal portion of the suspension board with circuit shown in FIG. 2, (a) showing a sectional view thereof taken along line A-A of FIG. 2, and (b) showing a sectional view thereof taken along line B-B.

DETAILED DESCRIPTION OF THE PREFERRED EMBODIMENTS

Figure 1:
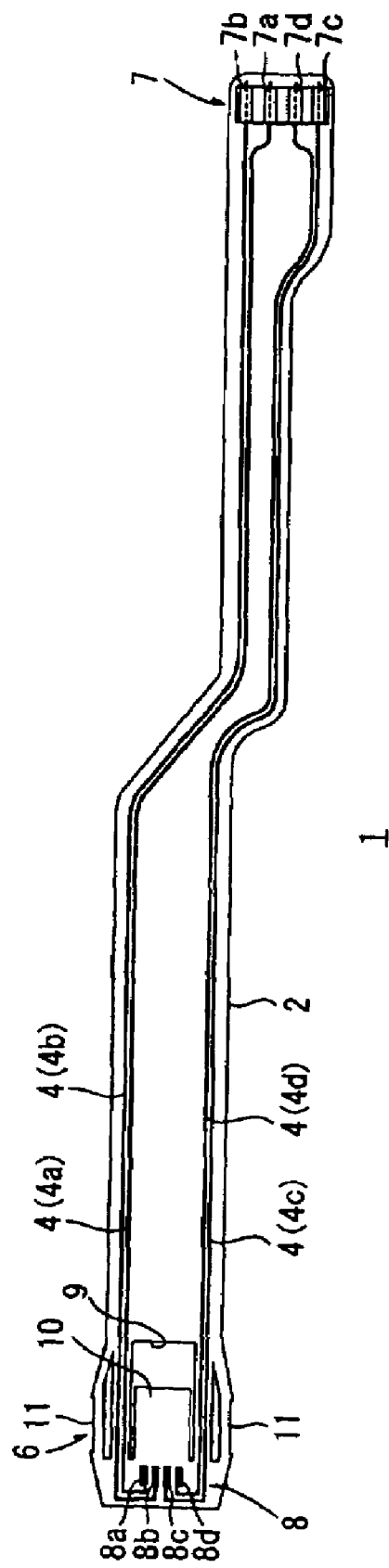
FIG. 1 is a plane view showing an embodiment of a suspension board with circuit of the present invention.

FIG. 1 is a plane view showing an embodiment of a suspension board with circuit of the present invention. FIG. 2 is a plane view of a principal part of a gimbal portion of the suspension board with circuit shown in FIG. 1. FIG. 3(a) shows a sectional view taken along line A-A of FIG. 2, and FIG. 3(b) shows a sectional view taken along line B-B of FIG. 2. In FIG. 3, a seed film 16 and a metal coating 18 mentioned later are omitted.

In FIG. 1, the suspension board with circuit 1 is designed to mount a magnetic head of a hard disc drive (not shown) thereon and hold it against an airflow generated when the magnetic head and a magnetic disk run relative to each other, while supporting the magnetic head closely spaced from the magnetic head. A wiring circuit pattern 4a, 4b, 4c, 4d to connect between the magnetic head and a read/write board is integrally formed on the suspension board with circuit 1.

This suspension board with circuit 1 comprises, as shown in FIG. 3, a supporting board 2 extending longitudinally and serving as a metal supporting layer, an insulating base layer 3 formed on the supporting board 2, a conductor layer 4 formed in the form of a wiring circuit pattern on the insulating base layer 3, and an insulating cover layer 5, formed on the insulating base layer 3, to cover the conductor layer 4.

The supporting board 2 is formed in a generally crank-like form along the longitudinal direction, as shown in FIG. 1. The supporting board 2 has a gimbal portion 6 formed at a front end portion thereof (one lengthwise end thereof), and an external terminal portion 7 to connect with a read/write substrate formed at a rear end portion thereof (the other lengthwise end thereof).

The insulating base layer 3 is formed on the supporting board 2 to extend continuously. It has a front end portion which is presented in the form of a magnetic head terminal portion 8 mentioned later shown in FIG. 2 and a rear end portion which is presented in the form of an external terminal portion 7 not shown. As partly shown in FIG. 2, the insulating base layer 3 extending between the front end portion and the rear end portion is formed to have two spaced apart portions at a predetermined distance arranged at the opposite sides of the supporting board 2 in the widthwise direction thereof (orthogonal to the longitudinal direction).

The conductor layer 4 is formed in the form of a wired circuit pattern on the insulating base layer 3 which is formed to have two spaced apart portions between the front end portion and the rear end portion of the insulating base layer 3. The wired circuit pattern on the conductor layer 4 comprises lines of wire 4a, 4b and 4c, 4d (two lines for each) arranged in parallel with each other. To be more specific, the lines of wire 4a and 4b, 4c and 4d are extended along the longitudinal direction and arranged in pairs (4a and 4b, and 4c and 4d) on the insulating base layer 3 to be spaced apart from each other at a predetermined distance with respect to the widthwise direction. The respective pairs of lines of wire 4a and 4b, and 4c and 4d are connected to their respective terminals 8a and 8b, and 8c and 8d of the magnetic head terminal portion 8 at the front end portion thereof and are connected to their respective terminals 7a and 7b, and 7c and 7d of the external terminal portion 7, as shown in FIG. 1.

As partly shown in FIG. 2, the insulating cover layer 5 is formed on the insulating base layer 3, to cover the lines of wire 4a, 4b, 4c, and 4d and extend along the insulating base layer 3.

The gimbal portion 6 formed in the front end portion of the suspension board with circuit 1 has, as shown in FIG. 2, an outer shape in which the supporting board 2 protrudes outwardly from both widthwise sides of the suspension board with circuit 1 at the front end portion thereof. The front end portion of the suspension board with circuit 1 including this protruding portion is presented in the form of the gimbal portion 6. The protruding portion of the supporting board 2 has a widthwise length of e.g. 0.03-3 mm, or preferably 1-2.5 mm.

The supporting board 2 has a U-shaped cutout portion 9 formed in the gimbal portion 6, when viewed from top. A remaining part of the supporting board 2 left in the cutout portion 9 is presented in the form of a tongue portion 10 having a generally rectangular shape, when viewed from top, for mounting the slider mounting the magnetic head.

Both widthwise sides of the tongue 10 and both widthwise sides of the cutout portion 9 confronting the tongue portion 10 with respect to the longitudinal direction are presented in the form of an outrigger portion 11.

A portion of the suspension board with circuit 1 located in front of the cutout portion 9 and tongue portion 10 is presented in the form of a magnetic head terminal portion 8 for connecting with the magnetic head.

The insulating base layer 3, insulating cover layer 5, and lines of wire interposed therebetween 4a and 4b, and 4c and 4d are formed in two sets and arranged in two lines at the outrigger portions 11, passing through the cutout portion 9 at the outside of both widthwise ends of the tongue portion 10 along the longitudinal direction, so that they are arranged not to be overlapped with the supporting board 2 at the outrigger portions 11. This arrangement can produce a reduced rigidity of the outrigger portions 11.

The insulating base layer 3 and insulating cover layer 5 of each line has a widthwise length of 0.03-5 mm, or preferably 1-3 mm, at the outrigger portion 11.

Each pair of lines of wire 4a and 4b, and 4c and 4d, interposed between the insulating base layer 3 and the insulating cover layer 5 arranged in one line, have a width of e.g. 10-150 µm, or preferably 20-100 µm. The pair of lines of wire 4a and 4b, and 4c and 4d are spaced from each other at a distance of e.g. 10-200 µm, or preferably 20-150 µm.

The insulating cover layer 5 passing through the cutout portion 9 is opened at the outrigger portion 11 to extend along the longitudinal direction, and the lines of wire 4a, 4b, 4c, 4d are exposed from the opening 12.

To be more specific, the opening 12 of the insulating cover layer 5 has a generally rectangular shape as viewed from top. In the opening 12, front openings 12a, 12b, 12c, and 12d and rear openings 12e, 12f, 12g, and 12h are formed to correspond to the lines of wire 4a, 4b, 4c, and 4d passing through the cutout portion 9, respectively, and are spaced from each other at predetermined intervals in the longitudinal direction.

The front openings 12a, 12b, 12c, and 12d are formed to have a longitudinal length of e.g. 2 mm or less, or preferably 0.5-1.5 mm. The rear openings 12e, 12f, 12g, and 12h are formed to have a longitudinal length of e.g. 2 mm or less, or preferably 0.5-1.5 mm. When the longitudinal length of the opening 12 is longer than this, the lines of wire 4a, 4b, 4c, and 4d may possibly be stripped from the insulating base layer 3.

Also, the front openings 12a, 12b, 12c, and 12d and the rear openings 12e, 12f, 12g, and 12h are arranged at spaced intervals of e.g. 0.2-1 mm, or preferably 0.25-0.5 mm.

In addition, the longitudinal length of the front openings 12a, 12b, 12c, and 12d, the longitudinal length of the rear openings 12e, 12f, 12g, and 12h, and the longitudinal length of the space intervals therebetween are set to be in the ratios of 0.6-3.0:0.6-3.0:1.

The front openings 12a, 12b, 12c, and 12d and the rear openings 12e, 12f, 12g, and 12h are formed to have widthwise lengths of e.g. 0.1-1 mm, or preferably 0.2-0.5 mm.

The insulating base layer 3, the insulating cover layer 5, and the lines of wire 4a, 4b, 4c, and 4d interposed therebetween are formed on the supporting board 2 at the magnetic head terminal portion 8.

Free ends of the lines of wire 4a, 4b, 4c, and 4d at the magnetic head terminal portion 8 are presented in the form of terminals 8a, 8b, 8c, and 8d having generally rectangular shapes, as viewed from top, for connection with the magnetic head. The respective terminals 8a, 8b, 8c, and 8d are arranged in a parallel relation at locations confronting the tongue portion 10 in the longitudinal direction, to be spaced from each other at predetermined intervals along the widthwise direction. The insulating cover layer 5 is opened at a portion thereof including the locations corresponding to the terminals 8a, 8b, 8c, and 8d, so that the respective terminals 8a, 8b, 8c, and 8d are exposed from the insulating cover layer 5.

The external terminal portion 7 is presented in the form of the rear end portion of the suspension board with circuit 1, as shown in FIG. 1. The insulating base layer 3, the insulating cover layer 5, and the lines of wire 4a, 4b, 4c, and 4d interposed therebetween are formed on the supporting board 2 at the external terminal portion 7.

Free ends of the lines of wire 4a, 4b, 4c, and 4d at the external terminal portion 7 are presented in the form of terminals 7a, 7b, 7c, and 7d having generally rectangular shapes, as viewed from top, for connection with the read/write board. The respective terminals 7a, 7b, 7c, and 7d are arranged in a parallel relation to be spaced from each other at predetermined intervals along the widthwise direction. The insulating cover layer 5 is opened at a portion thereof including the locations corresponding to the terminals 7a, 7b, 7c, and 7d, so that the respective terminals 7a, 7b, 7c, and 7d are exposed from the insulating cover layer 5.

Figure 4:
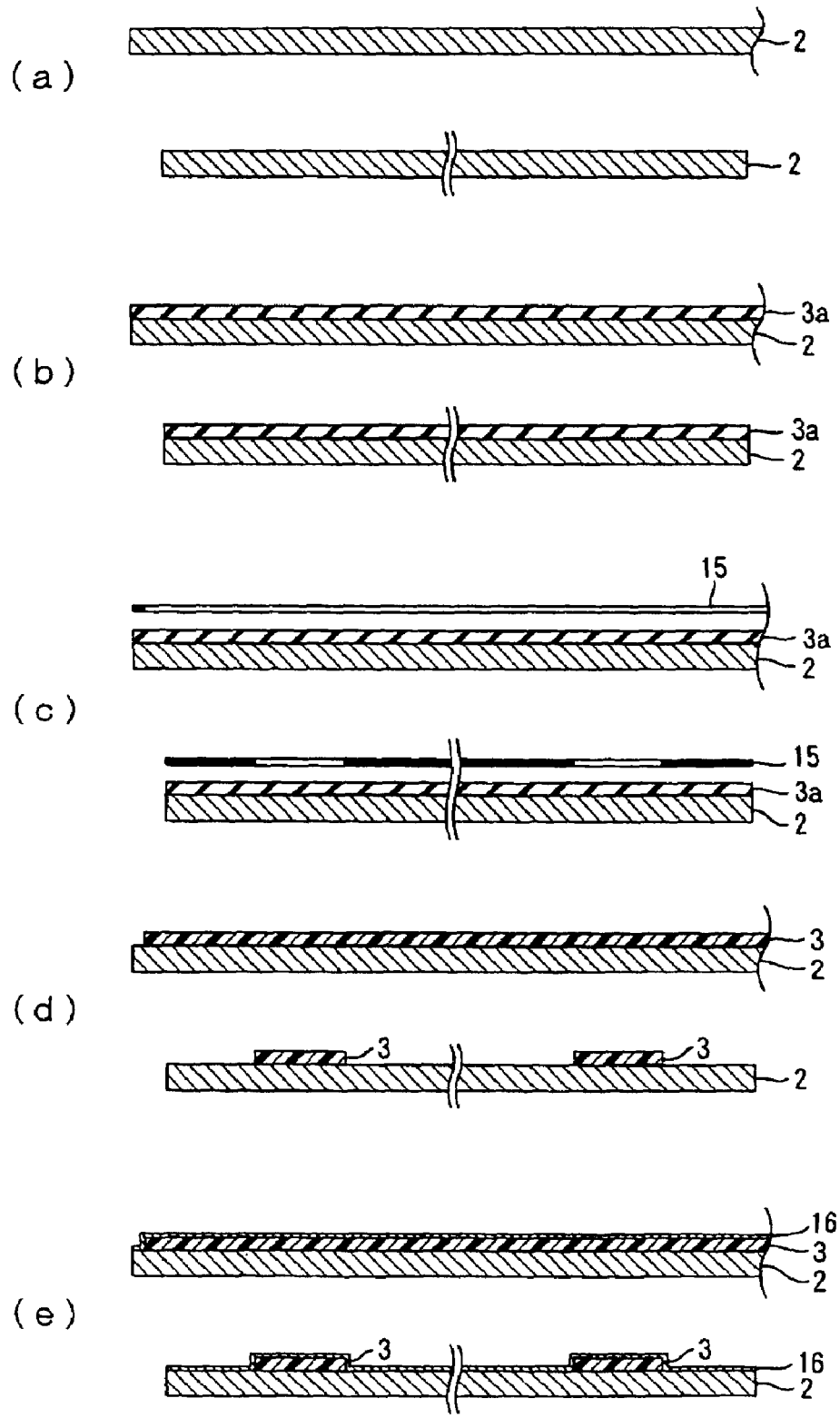
FIG. 4 is a process drawing showing a production method of the suspension board with circuit shown in FIG. 1, (a) showing the process of preparing a supporting board; (b) showing the process of coating a solution of precursor of photosensitive polyimide resin over the entire surface of the supporting board and then heating the coated solution, thereby forming a coating of the precursor of the photosensitive polyimide resin on the supporting board; (c) showing the process of exposing the coating to light through a photo mask and developing it, thereby forming the coating into a predetermined pattern; (d) showing the process of curing the coating to form an insulting base layer of polyimide resin to have a predetermined pattern; and (e) showing the process of forming a seed film of a thin conductive film on the entire surface of the supporting board and insulating base layer.
Figure 5:
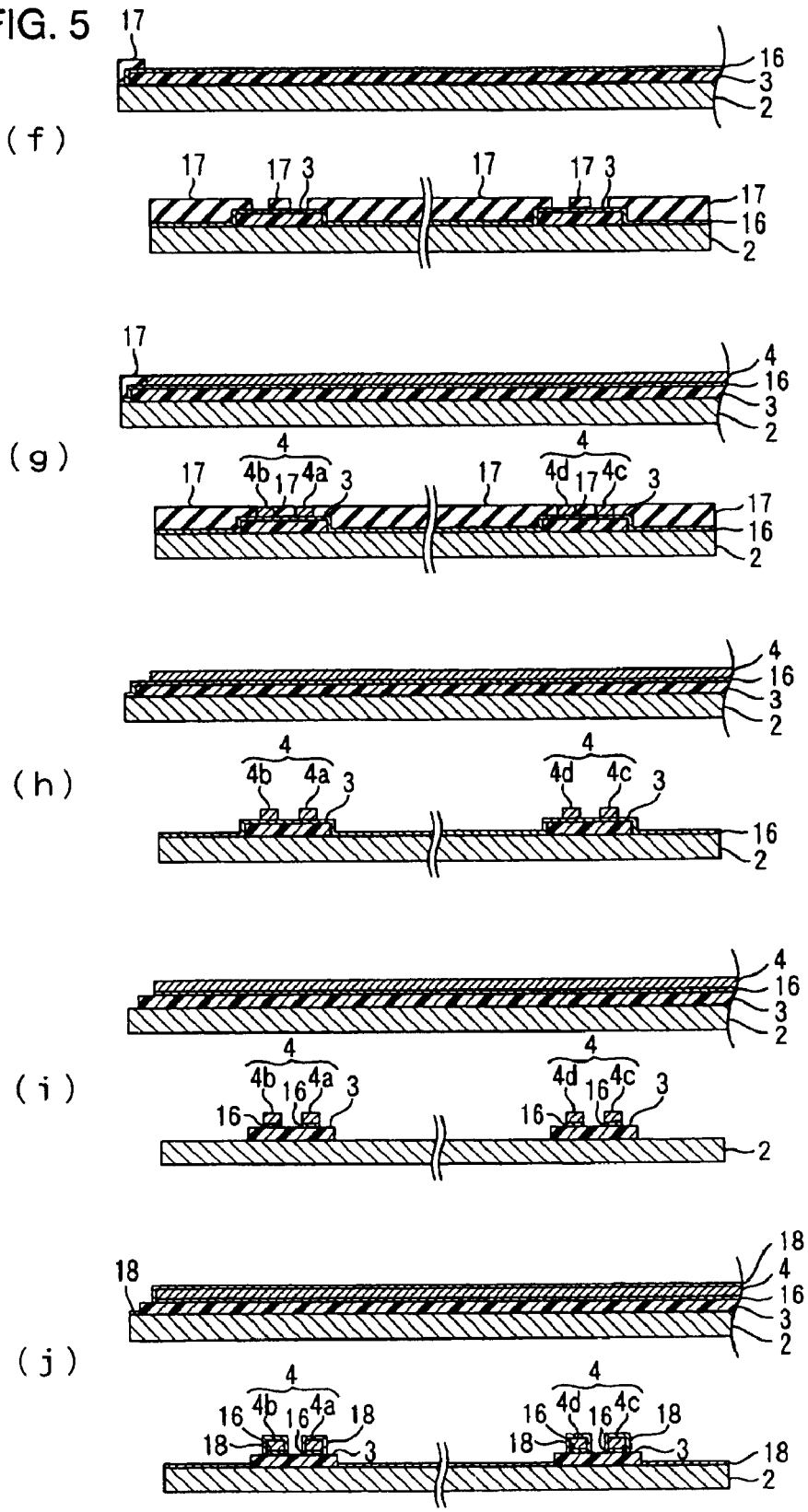
FIG. 5 is a process drawing, which is the sequence of FIG. 4, showing the production method of the suspension board with circuit shown in FIG. 1, (f) showing the process of forming on the seed film a plating resist having a reverse pattern to a wiring circuit pattern; (g) showing the process of forming a conductor layer of the wiring circuit pattern by plating on an area of the insulating base layer where the plating resist is not formed; (h) showing the process of removing the plating resist; (i) showing the process of removing the part of the seed film where the plating resist was formed; and (j) showing the process of forming a metal coating on a surface of the conductor layer and a surface of the supporting board.
Figure 6:
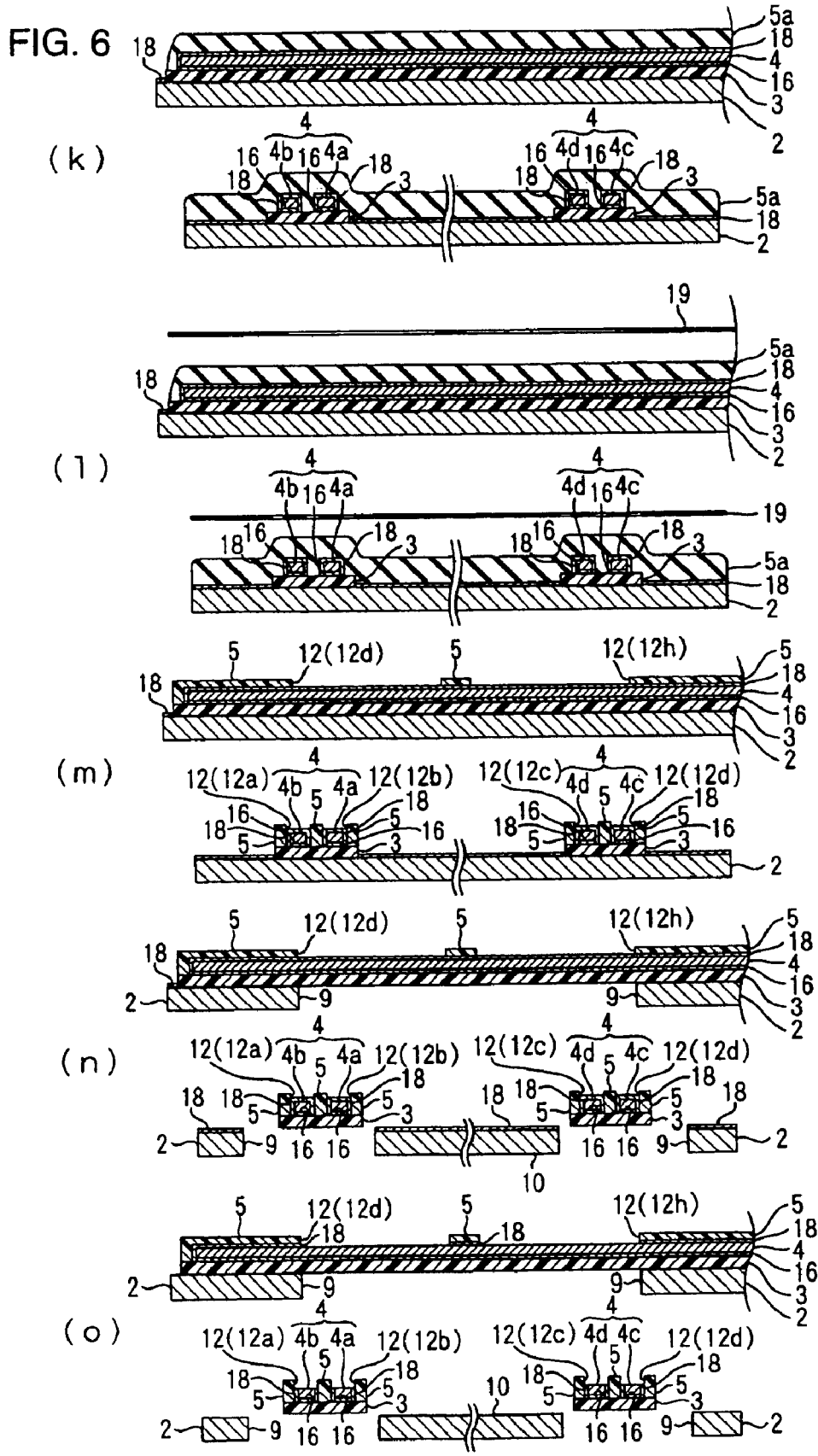
FIG. 6 is a process drawing, which is the sequence of FIG. 5, showing the production method of the suspension board with circuit shown in FIG. 1, (k) showing the process of coating a solution of precursor of photosensitive polyimide resin on the insulating base layer and metal coating and then heating the coated solution, thereby forming a coating of the precursor of photosensitive polyimide resin; (l) showing the process of exposing the coating to light through a photo mask and then developing it, thereby forming the coating into a pattern to cover the conductor layer; (m) showing the process of curing the coating to form an insulting cover layer of polyimide resin on the insulating base layer so as to cover the conductor layer; and (n) showing the process of cutting the supporting board to form a cutout; and (o) showing the process of removing the metal coating.

Next, a production method of this suspension board with circuit 1 will be briefly described with reference to FIGS. 4-6. It should be noted that in FIGS. 4-6 illustrating the respective process steps, part of the suspension board with circuit 1 for the outrigger portion 11 to be formed is presented above as a sectional view taken along a longitudinal direction of the suspension board with circuit 1 (a sectional view taken along line A-A of FIG. 2) and part of the suspension board with circuit 1 for the outrigger portion 11 to be formed is presented below as a sectional view taken along a widthwise direction of the suspension board with circuit 1 (a sectional view taken along line B-B of FIG. 2).

In this method, the supporting board 2 is prepared, first, as shown in FIG. 4(a). A metal foil or a thin metal sheet is preferably used as the supporting board 2. For example, stainless steel, 42-alloy, and the like are preferably used for the supporting board 2. Preferably, the supporting board 2 has a thickness of 10-25 μm, or preferably 15-25 μm and has a width of 50-500 mm, or preferably 125-300 mm.

Then, the insulating base layer 3 is formed in a predetermined pattern on the supporting board 2, as shown in FIG. 4(b) to FIG. 4(d). The insulating materials that may be used for forming the insulating base layer 3 include, for example, synthetic resins, such as polyimide resin, acrylic resin, polyether nitrile resin, polyether sulfonic resin, polyethylene terephthalate resin, polyethylene naphthalate resin, and polyvinyl chloride resin. Of these synthetic resins, a photosensitive synthetic resin is preferably used for forming the insulating base layer 3 in the predetermined pattern as mentioned above. The photosensitive polyimide resin is further preferably used therefor.

For example when photosensitive polyimide resin is used to form the insulating base layer 3 in the predetermined pattern on the supporting board 2, a solution of precursor of the photosensitive polyimide resin (polyamic acid resin) is coated over the entire surface of the supporting board 2, as shown in FIG. 4(b). Then, the coated polyimide resin is heated at e.g. 60-150° C., or preferably at 80-120° C., to form a coating 3a of the precursor of the photosensitive polyimide resin.

Then, the coating 3a is exposed to light through a photo mask 15, as shown in FIG. 4(c), and, if required, it is heated to a predetermined temperature. Thereafter, the coating 3a is developed to be formed into a predetermined pattern mentioned above.

When the exposed-to-light portion of the coating 3a irradiated is heated at a temperature of e.g. 130° C. or more to less than 150° C., it is solubilized (positive type) in the next developing process. On the other hand, when heated at a temperature of e.g. 150° C. or more to 180° C. or less, it is insolubilized (negative type) in the next developing process. The development can be performed by any known method, such as a dipping process and a spraying process, using a known developing solution such as alkaline developer. In this method, it is preferable that the negative pattern is formed in the coating 3a. Illustrated in FIG. 4 is an embodiment using the process steps for forming the negative pattern.

Then, the coating 3a of the precursor of the polyimide resin thus patterned is heated finally to e.g. 250° C. or more to be cured (imidized), whereby the insulating base layer 3 of polyimide resin is formed in the predetermined pattern, as shown in FIG. 4(d).

As an alternative to using the photosensitive synthetic resin, for example the synthetic resin previously formed in the form of a dry film having a predetermined pattern mentioned above may be used and adhesively bonded to the supporting board 2.

The insulating base layer 3 thus formed has a thickness of e.g. 5-30 μm, or preferably 7-15 μm.

Then, the conductor layer 4 is formed in the wiring circuit pattern mentioned above on the insulating base layer 3. The conductor layer 4 in the form of the wiring circuit pattern is formed of conductive material. The conductive materials that may be used include, for example, copper, nickel, gold, solder, or alloys thereof. Copper is preferably used. The conductor layer 4 can be provided by forming the conductor layer 4 in the predetermined wiring circuit pattern on the insulating base layer 3 by a known patterning process, such as a subtractive process and an additive process.

In the subtractive process, the conductor layer 4 is laminated on the entire surface of the insulating base layer 3 using, if necessary, an adhesive layer, first. Then, an etching resist having the same pattern as the wiring circuit pattern is formed on the conductor layer 4, and the conductor layer 4 is etched using the etching resist as a resist. Thereafter, the etching resist is removed.

In the additive process, a seed film of a thin film of the conductive material is formed on the insulating base layer 3, first. Then, after a plating resist having a reverse pattern to the wiring circuit pattern is formed on the seed film, the conductor layer 4 is formed in the form of the wiring circuit pattern by plating on a surface of the seed film on which the plating resist is not formed. Thereafter, the plating resist and the part of the seed film on which the plating resist was laminated are removed.

Of these patterning processes, the additive process is preferably used to form a fine wiring circuit pattern, as shown in FIG. 4(e) to FIG. 5(i). Specifically, in the additive process, the seed film 16 of a thin film of the conductive material is formed on the entire surface of the supporting board 2 and the insulating base layer 3, first, as shown in FIG. 4(e). Preferably, the seed film 16 is formed using a vacuum deposition process, particularly a sputtering process. Chromium and copper are preferably used as the conductive material used for forming the seed film 16. To be more specific, for example a thin chromium film and a thin copper film are preferably formed in sequence on the entire surface of the supporting board 2 and insulating base layer 3 by the sputtering process. Preferably, the thin chromium film has thickness of 100-600 Å and the thin copper film has thickness of 500-2,000 Å.

Sequentially, a plating resist 17 having a reverse pattern to the wiring circuit pattern is formed on the seed film 16, as shown in FIG. 5(f). The plating resist 17 may be formed in the form of the resist pattern mentioned above by a known process using a dry film photoresist, for example. Then, the conductor layer 4 of the wiring circuit pattern is formed by plating on an area of the seed film 16 where the plating resist 17 is not formed, as shown in FIG. 5(g). Either the electrolytic plating or the electroless plating may be used to form the conductor layer 4. Preferably, the electrolytic plating, particularly the electrolytic copper plating, is used therefor.

The conductor layer 4 has a thickness of e.g. 3-20 μm, or preferably 5-15 μm.

Then, the plating resist 17 is removed by a known etching process, such as a chemical etching (wet etching), or by stripping, as shown in FIG. 5(h). Then, the seed film 16 on which the plating resist 17 was formed is removed by a known etching process, such as the chemical etching (wet etching), as shown in FIG. 5(i). After the processes mentioned above, the conductor layer 4 in the form of the wiring circuit pattern (including the terminals 8a, 8b, 8c, and 8d of the magnetic head terminal portion 8 and the terminals 7a, 7b, 7c, and 7d of the external terminal portion 7) is formed on the insulating base layer 3.

Then, a metal coating 18 is formed on a surface of the conductor layer 4, as shown in FIG. 5(j). Preferably, the metal coating 18 is formed by electroless nickel plating in the form of a hard, thin nickel film. It is enough that the metal coating 18 has a thickness enough to prevent the surface of the conductor layer 4 from being exposed. For example, the thickness of the metal coating 18 is in order of 0.05-0.1 μm. The metal coating 18 is formed on a surface of the supporting board 2 as well.

Sequentially, an insulating cover layer 5 for covering the conductor layer 4 is formed on the insulating base layer 3, as shown in FIG. 6(k) to FIG. 6(m). The same insulating material as that for the insulating base layer 3 is used for forming the insulating cover layer 5. Preferably, photosensitive polyimide resin is used.

When the insulating cover layer 5 is formed using e.g. the photosensitive polyimide resin, a solution of precursor of the photosensitive polyimide resin (polyamic acid resin) is coated over the entire surface of the insulating base layer 3 and the metal coating 18, as shown in FIG. 6(k), and then is heated at e.g. 60-150° C., or preferably at 80-120° C., to form a coating 5a of the precursor of the photosensitive polyimide resin. Then, the coating 5a is exposed to light through the photo mask 19, as shown in FIG. 6(l). If required, it may be heated to a predetermined temperature. Thereafter, the coating 5a is developed and thereby is formed to have a predetermined pattern to cover the conductor layer 4 with the coating 5a.

Also, in the formation of the pattern of the insulating cover layer 5, the opening 12 in the outrigger portions 11, the openings in the magnetic head terminal portion 8, and the openings in the external terminal portion 7 are formed so that the conductor layer 4 is exposed therefrom, as mentioned above.

The coating 5a can be exposed to light and developed under the same condition as the condition for exposing and developing the insulating base layer 3. The patterning of the coating 5a is preferably produced with the negative image. Shown in FIG. 6 is an embodied form in which the coating 5a is patterned to have the negative image.

Then, the coating 5a of the precursor of the photosensitive polyimide resin thus patterned is heated finally to e.g. 250° C. or more to be cured (imidized), whereby the insulating cover layer 5 of polyimide resin is formed on the insulating base layer 3 to cover the conductor layer 4, as shown in FIG. 6(m). The insulating cover layer 5 has a thickness of e.g. 2-25 μm, or preferably 3-7 μm.

Then, the supporting board 2 is cut out in a predetermined shape by chemical etching, to form a generally U-shaped cutout 9 in it, as shown in FIG. 6(n). Thereafter, the metal coating 18 exposed from the opening 12 in the outrigger portions 11, the opening in the magnetic head terminal portion 8, and the opening in the external terminal portion 7 is removed by a known etching process such as a chemical etching (wet etching), as shown in FIG. 6(o). In this step, the metal coating 18 formed on the surface of the supporting board 2 is also removed.

Thereafter, if required, a nickel plating layer and a gold plating layer are sequentially formed on the conductor layer 4 exposed from the openings in the magnetic head terminal portion 8 and the openings in the external terminal portion 7 by electrolytic nickel plating and electrolytic gold plating. The suspension board with circuit 1 is produced in the processes mentioned above.

In this suspension board with circuit 1, since the conductor layer 4 is exposed from the opening 12 formed in the insulating cover layer 5 at the outrigger portions 11, the conductor layer 4 can be reduced in rigidity to such an extent that no insulating cover layer 5 is provided on the exposed part of the conductor layer 4. This can permit precise adjustment of floatation (floatation angle) of even a small-sized slider to a magnetic disc.

Although the embodiment wherein the insulating cover layer 5 in the outrigger portions 11 is partly opened to form the opening 12 has been described above, the lines of wire 4a, 4b, 4c, 4d may be exposed by allowing no insulating cover layer 5 to be formed in the outrigger portion 11.

Although the embodiment wherein the cutout 9 is formed in the outrigger portion 11 so that the insulating base layer 3, the insulating cover layer 5, and the lines of wire 4a, 4b, 4c, 4d interposed therebetween are not overlapped with the supporting board 2 has been described above, the cutout 9 may be formed in the outrigger portion 11 so that the insulating base layer 3, the insulating cover layer 5, and the lines of wire 4a, 4b, 4c, 4d interposed therebetween can be overlapped with the supporting board 2.

EXAMPLE

While in the following, the present invention will be described in further detail with reference to Examples, the present invention is not limited thereto.

Example 1

The following processes were carried out using the roll-to-roll process, to obtain a suspension board with circuit.

A supporting board of a stainless foil of 300 mm wide, 20 μm thick, and 120 m long was prepared (Cf. FIG. 4(a)). Then, after a solution of polyamic acid resin was coated over the entire surface of the supporting board, the coated resin was heated at 100° C., to form a coating of the polyamic acid resin having a thickness of 25 μm (Cf. FIG. 4(b)). Then, the coating thus formed was exposed to light of 720 mJ/cm² through a photo mask and was heated at 180° C. Then, it was developed using alkaline developer (Cf. FIG. 4(c)). Thereafter, the coating was cured at a highest temperature of 420° C. After the processes mentioned above, the insulating base layer of polyimide resin was formed in the form of a specific pattern including a magnetic head terminal portion formed at the front end portion thereof, an external terminal portion formed at the rear end portion thereof, and two spaced apart portions formed at both widthwise sides of the supporting board and extending between the front end portion and the rear end portion. (Cf. FIG. 4(d)). The thickness of the insulating base layer thus formed was 10 μm.

Sequentially, a thin chromium film having thickness of 400 Å and a thin copper film having thickness of 700 Å were formed in sequence on the entire surface of the supporting board and insulating base layer by the sputtering process, to thereby form a seed film (Cf. FIG. 4(e)). Then, after a dry film photoresist was laminated on the seed film, it was exposed to light of 235 mJ/cm² through the photo mask and then was developed to remove an unexposed portion, using alkaline developer. After these processes, a plating resist having a reverse pattern to the wiring circuit pattern was formed on the seed film (Cf. FIG. 5(f)).

Then, the conductor layer in the form of the wiring circuit pattern was formed by electrolytic copper plating on an area of the insulating base layer where the plating resist was not formed (Cf. FIG. 5(g)).

This wiring circuit pattern comprises two lines of wire in each pair arranged in parallel relation on the insulating base layer comprising two spaced apart portions formed between the front end portion and the rear end portion. The respective lines of wire were formed in the form of terminals of the magnetic head terminal portion at the front end portion thereof and were formed in the form of terminals of the external terminal portion at the rear end portion thereof. The thickness of the conductor layer was 12 μm.

Then, after the plating resist was stripped (FIG. 5(h)), the seed film on which the plating-resist had been formed was removed by the chemical etching (Cf. FIG. 5(i)). Then, a metal coating of a hard, thin nickel film having a thickness of 0.1 μm was formed on a surface of the conductor layer by electroless nickel plating (Cf. FIG. 5(j)). The metal coating was formed on a surface of the supporting board as well.

Then, after a solution of polyamic acid resin was coated over the entire surface of the insulating base layer and metal coating, the coated resin was heated at 100° C., to form a coating of the polyamic acid resin having a thickness of 20 μm (Cf. FIG. 6(k)). Then, the coating thus formed was exposed to light of 720 mJ/cm² through the photo mask and was heated at 180° C. Then, it was developed using alkaline developer and thereby was patterned so that the conductor layer was covered with the coating (FIG. 6(l)). When patterned, the coating was formed on the insulating base layer, to form the opening in the outrigger portion, the openings in the magnetic head terminal portion, and the opening in the external terminal portion. Thereafter, the coating was cured at a highest temperature of 420° C., whereby the insulating cover layer of polyimide resin was formed to have a predetermined pattern (Cf. FIG. 6(m)). The thickness of the insulating cover layer thus formed was 5 μm.

Then, after the photosensitive dry film resist was laminated over the entire surface of the supporting board, except the cutout forming portion, the coating was exposed to light of 105 mJ/cm². Then, it was developed using alkaline developer, to form an etching resist. Thereafter, with the etching resist thus formed as the resist, the coating was etched, using solution of ferric chloride, to form the cutout (Cf. FIG. 6(n)).

Thereafter, the metal coating exposed from the opening in the outrigger portion, the openings of the magnetic head terminal portion, and the openings in the external terminal portion was removed by the chemical etching (Cf. FIG. 6(o)). The metal coating formed on the surface of the supporting board was also removed.

Thereafter, a nickel plating layer and a gold plating layer are formed sequentially on the conductor layer exposed from the openings in the magnetic head terminal portion and the openings in the external terminal portion by the electrolytic nickel plating and the electrolytic gold plating, respectively. The suspension board with circuit was produced by the processes mentioned above.

In the suspension board with circuit thus obtained, the opening in the outrigger portion was formed so that the front openings and the rear openings were spaced apart from each other at predetermined intervals in the longitudinal direction.

The front openings had longitudinal lengths of 0.8 mm and the rear openings had longitudinal lengths of 0.8 mm, the in-between space between them had the longitudinal length of 0.3 mm.

Example 2

Except that the insulating cover layer was not formed in the outrigger portion, so that the conductor layer at the outrigger portion are wholly exposed, the same process steps as those of Example 1 were taken to obtain the suspension board with circuit.

In the suspension board with circuit thus obtained, the outrigger portion had a longitudinal length (a longitudinal length of the outrigger portion in which the insulating cover layer was not formed) of 1.5 mm.

While the illustrative embodiments of the present invention are provided in the above description, such is for illustrative purpose only and it is not to be construed restrictively. Modification and variation of the present invention that will be obvious to those skilled in the art is to be covered by the following claims.

The disclosure of Japanese patent application Serial No. 2004-140319, filed on May 10, 2004, is incorporated herein by reference.

What is claimed is:

1. A suspension board with circuit comprising:

a metal supporting layer extending in a longitudinal direction;

an insulating base layer formed on the metal supporting layer;

a conductor layer formed on the insulating base layer; and an insulating cover layer, formed over the insulating base layer, so as to cover the conductor layer;

the suspension board with circuit further comprising:

a tongue portion for mounting a slider having a magnetic head thereon; and outrigger portions provided at both sides of the tongue portion for adjusting floatation of the slider to a magnetic disc, wherein each of the outrigger portions has a front opening located at one longitudinal position and a rear opening located at another longitudinal position, from which a part of the conductor layer is exposed, formed in the insulating cover layer, and the front opening at the one longitudinal position and the rear opening at the other longitudinal position are formed in a spaced relation to each other in the longitudinal direction.

2. The suspension board with circuit according to claim 1, wherein the front opening at the one longitudinal position and the rear opening at the other longitudinal position each have a length continuously extending along the longitudinal direction of 2 mm or less.

3. The suspension board with circuit according to claim 1, wherein the metal supporting layer is provided in the outrigger portions, not to overlap with the insulating base layer, the conductor layer, and the insulating cover layer.

4. The suspension board with circuit according to claim 1, further comprising:
an external terminal portion for connection to a read/write board, and including a plurality of terminals thereon.

5. The suspension board with circuit according to claim 1, further comprising:
a U-shaped cutout portion, when the suspension board is viewed in a plane view, formed in the metal supporting layer, the tongue portion being formed by a remaining part of the metal supporting layer left in the U-shaped cutout portion.

6. The suspension board with circuit according to claim 5, wherein the insulating base layer, the conductor layer and the insulating cover layer are disposed in two sets and arranged in two lines at the outrigger portions, passing through the U-shaped cutout portion at an outside of both widthwise sides of the tongue portion along the longitudinal direction.

7. The suspension board with circuit according to claim 1, wherein the front and rear openings are generally rectangular in shape.

* * * * *